United States Patent
Orio

(10) Patent No.: US 8,370,713 B2
(45) Date of Patent: *Feb. 5, 2013

(54) ERROR CORRECTION CODE DECODING DEVICE

(75) Inventor: Masao Orio, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/111,557

(22) Filed: May 19, 2011

(65) Prior Publication Data

US 2012/0131410 A1 May 24, 2012

Related U.S. Application Data

(62) Division of application No. 11/870,586, filed on Oct. 11, 2007, now Pat. No. 8,010,867.

(30) Foreign Application Priority Data

Oct. 12, 2006 (JP) .................................. 2006-279201

(51) Int. Cl.
*G11C 29/00* (2006.01)
(52) U.S. Cl. ....................................................... 714/763
(58) Field of Classification Search .................... 714/763
See application file for complete search history.

(56) References Cited

U.S. PATENT DOCUMENTS

| 6,678,843 | B2 | 1/2004 | Giuletti et al. | |
|---|---|---|---|---|
| 7,127,656 | B2 | 10/2006 | Van Stralen et al. | |
| 7,590,929 | B2 | 9/2009 | Morita et al. | |
| 7,743,287 | B2 | 6/2010 | Dimou | |
| 2002/0129317 | A1* | 9/2002 | Nicol et al. | 714/792 |
| 2004/0025103 | A1 | 2/2004 | Obuchii et al. | |
| 2004/0202020 | A1* | 10/2004 | Fujito et al. | 365/185.2 |

FOREIGN PATENT DOCUMENTS

| JP | 2004-15285 | 1/2004 |
|---|---|---|
| JP | 2006-217072 | 8/2006 |
| WO | 2006/082923 | 8/2006 |

OTHER PUBLICATIONS

Japanese Official Action—2007-262001—May 24, 2011

* cited by examiner

*Primary Examiner* — Albert Decady
*Assistant Examiner* — Enam Ahmed
(74) *Attorney, Agent, or Firm* — Young & Thompson

(57) ABSTRACT

An error correction code decoding device comprises a first memory having a memory space like a matrix, a first decoding unit writing a first information into the first memory along a first direction, a second decoding unit reading the first information from the first memory along a second direction and a plurality of turbo decoders included in the second decoding unit, and differentiating access timing to a same row or same column with each other.

4 Claims, 17 Drawing Sheets

TURBO DECODING DEVICE

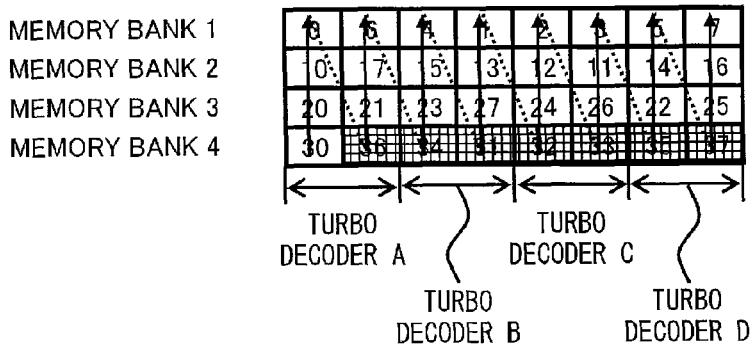
Fig. 16
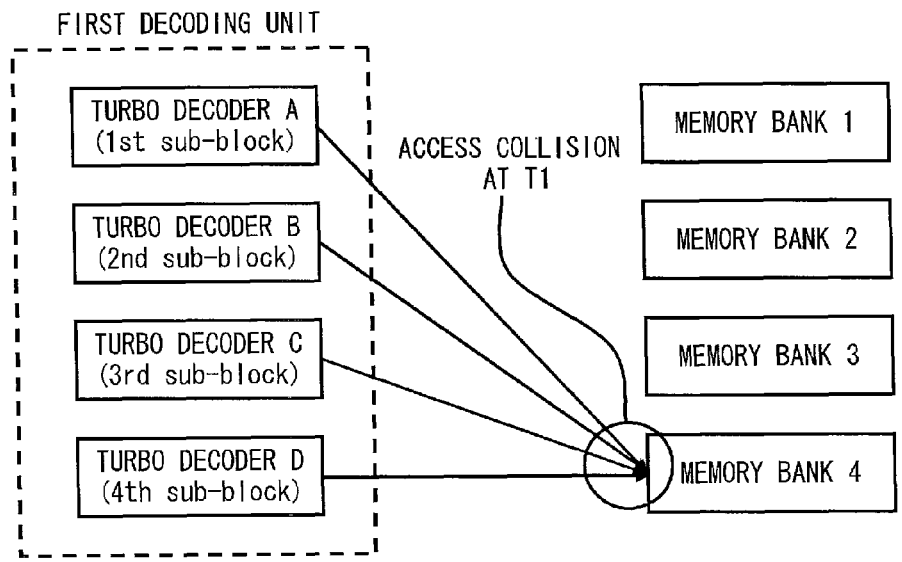
Fig. 17
Fig. 18

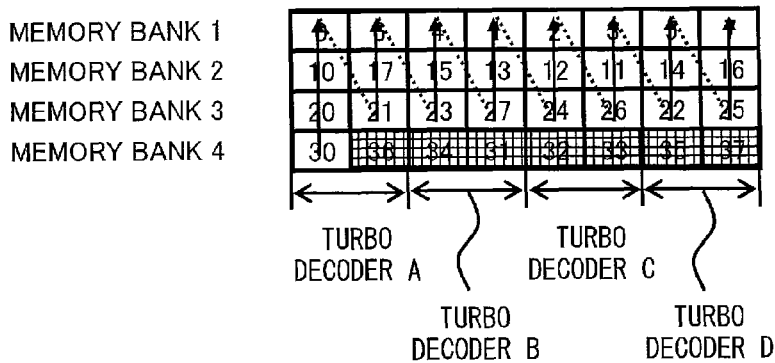
Fig. 19
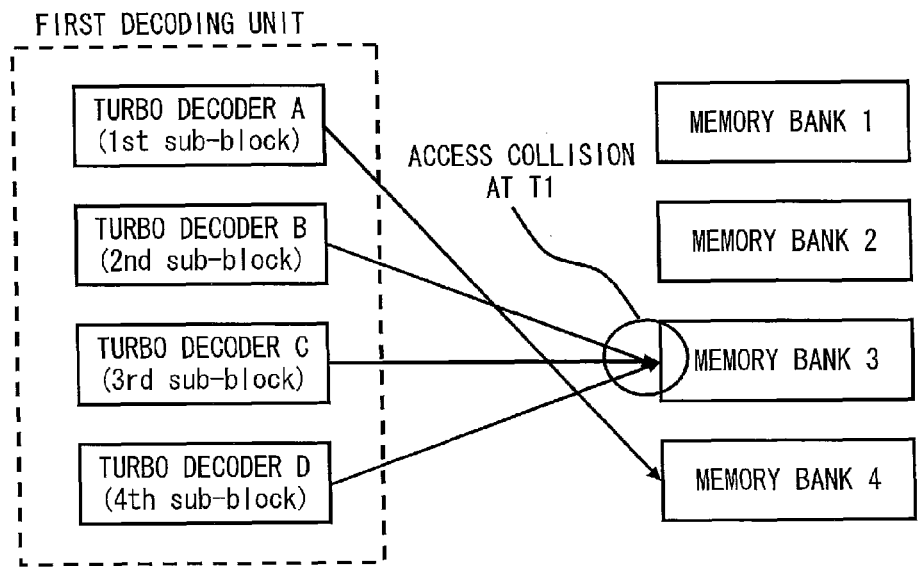
Fig. 20
Fig. 21

ERROR CORRECTION CODE DECODING DEVICE

BACKGROUND OF THE INVENTION

1. Field of the Invention

This invention relates to a decoder for decoding an error correcting code, particularly, to a decoder for decoding a turbo code.

2. Description of Related Art

In digital communications system, an error correcting code for correcting an error occurring in a transmission line is used. Particularly in mobile communication systems where the radio field intensity varies drastically due to fading and thereby an error is likely to occur, high correction capability is required for error correcting codes. Turbo codes, which are one example of error correcting codes, are notable as the codes having the error correction capability which is close to the Shannon limit and employed in the W-CDMA (Wideband Code Division Multiple Access) or CDMA-2000 as the third-generation mobile communication system, for example. This is disclosed in Japanese Unexamined Patent Application Publications No. 2004-15285.

FIG. 12 is a block diagram showing the structure of a typical encoding device for generating turbo codes. The encoding device 101 may be placed on the transmitting side of a communication system in order to encode information bits (systematic bits: systematic portion) U as pre-encoded data into turbo codes as parallel concatenated convolutional codes (PCCCs) and output the turbo codes to outside such as a transmission line. The turbo codes are not limited to the parallel concatenated convolutional codes and may be any codes which can be turbo-decoded, such as serial concatenated convolutional codes.

The encoding device 101 includes a first encoder 102, a second encoder 103 which serves as a systematic convolutional coder, and an interleaver 104 which interleaves (i.e. rearranges) data as shown in FIG. 12.

The first encoder 102 encodes input systematic portion U to generate redundancy bits (hereinafter as "parity bits") P and outputs the parity bits P to outside. The interleaver 104 rearranges each bit of the input systematic portion U into a prescribed interleaved pattern to generate a systematic portion Ub and outputs the generated systematic portion Ub to the second encoder 103. The second encoder 103 encodes the systematic portion Ub to generate parity bits Pb and outputs the parity bits Pb to outside.

In sum, the encoding device 101 generates the systematic portion U, the parity bits P, the systematic portion Ub, and the parity bits Pb. A pair of the systematic portion U and the parity bits P (U, P) is called a first elemental code E1, and a pair of the systematic portion Ub and the parity bits Pb (Ub, Pb) is called a second elemental code E2.

The turbo decoding has two features of (1) using a plurality of systematic encoders having a relatively simple and small structure, and (2) each encoder being connected to the information bits as an input to the encoder through the interleaver (rearranging element).

The feature (2) aims to generate different codeword sequences in different encoders by inputting the information bits with rearranged sequences to the encoder. The decoded result of each codeword is thus complemented between the codewords in the decoding side to thereby improve the error correction capability.

The feature (1) aims to use information bits for mutual complementation of decoded results between codewords. For example, the 3GPP (3rd Generation Partnership Project) mandates the use of two 8-state Systematic Convolutional Coders as the feature (1). The 3GPP is working on the standardization of the third-generation mobile communication system such as W-CDMA.

A pair of outputs {U, P} of an encoder 1 in FIG. 12 is called a first elemental code, and the other pair of outputs {Ub, Pb} is called a second elemental code. The bit Ub is not actually output, and three bits of U, P, and Pb are output to the subsequent stage. Although termination bits are actually output at the same time, they are ignored for simplification of the description. On this account, the coding rate of turbo codes defined by the 3GPP standard is ⅓.

Decoding such encoded turbo codes is called turbo decoding. In the turbo decoding process, decoding is performed repeatedly as a first decoding unit for decoding the first elemental code E1 and a second decoding unit for decoding the second elemental code E2 exchange external information. The number of decoding units is not limited to two, and two or more stages of decoders may be used in accordance with the number of elemental codes of the turbo codes.

FIG. 13 shows a typical decoding device for turbo decoding. The turbo decoding has one feature of (1) iterating the processing as exchanging the extrinsic information among a plurality of elemental codes.

As shown in FIG. 13, a typical decoding device 201 includes a first decoding unit 202, a second decoding unit 203, an interleaved memory 204, a de-interleaved memory 205, and a hard decision/CRC decision section 206. As shown in FIG. 13, the first decoding unit and the second decoding unit each has a plurality of decoders (turbo decoder) A-D. A plurality of decoders is used to perform a parallel processing. The turbo codes are divided into a plurality of sub blocks, and a plurality of decoders perform a parallel processing. In the following description, a turbo decoding process in the decoding device 201 is described, and parallel processing is described later.

The turbo decoding process in the decoding device 201 having such a configuration includes the following steps.

(A) Reading extrinsic information of the second decoding unit 203 from the de-interleaved memory 205 and inputting the extrinsic information and a first elemental code to the first decoding unit 202. Then, outputting extrinsic information from the first decoding unit 202 and writing it to the interleaved memory 204.

(B) Reading the extrinsic information of the first decoding unit 202 from the interleaved memory 204 and inputting the extrinsic information and a second elemental code to the second decoding unit 203. Then, outputting extrinsic information from the second decoding 203 and writing it to the de-interleaved memory 205.

(C) In the final iteration of the decoding process, reading a log likelihood ratio LLR of the second decoding unit 203 from the de-interleaved memory 205, making the hard decision in the hard decision/CRC decision section 206, and finally performing error checking by CRC.

In the turbo decoding process, the step (A) is performed first. The extrinsic information from the second decoding unit 203 is an initial value (=0) in this step. Then, the step (B) is performed and further the step (A) is performed again. Subsequently, the steps (B) and (A) are iterated an arbitrary number of times. In the final iteration, the step (B) is performed. At this step, the second decoding 203 outputs the log likelihood ratio rather than the extrinsic information. After that, the step (C) is performed finally.

Because the turbo codes are systematic bits, the information bits U are contained in a received sequence. The extrinsic information is a value (priori value) indicating the likelihood of "0" (equivalent with the likelihood of "1"), which is predefined for the information bits U prior to the decoding. The turbo decoding is the process that exchanges (mutually complements) the probability that each information bit is "0" in the decoding between the first and second elemental codes to thereby improve the accuracy of the probability and enhance the error correction capability.

In the above described turbo decoding process, interleaving and de-interleaving are performed as follows. FIGS. 14 and 15 are drawings that show interleaving and de-interleaving. FIG. 14 shows relationships among the first decoding unit 202 (precisely, each decoder of the first decoding unit), the second decoding unit 203 (each decoder of the second decoding unit), the interleaved memory 204 and de-interleaved memory 205. FIG. 15 shows access directions in memory spaces of the interleaved memory 204 and the de-interleaved memory 205. An access direction is different between the first decoding unit 202 (each decoder of the first decoding unit) and the second decoding unit 203 (each decoder of the second decoding unit).

The first decoding unit 202 outputs the extrinsic information to the interleaved memory 204. The first decoding unit 202 performs a sequential access to the interleaved memory 204. In this specification, the sequential access means an access along row direction in the memory space arranged as a matrix. That is, the extrinsic information is written in the interleaved memory 204 along row direction (See FIG. 15).

The second decoding unit 203 performs an interleaved access to the interleaved memory 204. In this specification, the interleaved access means an access along column direction to the memory space. That is, the extrinsic information written in the interleaved memory 204 is read along column direction (See FIG. 15). In FIG. 15, the interleaved access that read data from a bottom of the memory space to a top is shown.

Interleaving is performed by the above described interleaved access, and the second decoding unit processes the interleaved extrinsic information.

The second decoding unit 203 outputs the extrinsic information to the de-interleaved memory 205. The second decoding unit 203 performs the interleaved access to the de-interleaved memory 205. That is, the extrinsic information is written in the de-interleaved memory 205 along column direction (See FIG. 15).

The first decoding unit 202 performs the sequential access to the de-interleaved memory 205. That is, the extrinsic information written in the de-interleaved memory 205 is read along row direction (See FIG. 15). Therefore, the first decoding unit 202 read out the de-interleaved extrinsic information.

In one row line or one column line, data exchanging is performed in actual interleaving as shown numbers of in FIG. 16, description of complex interleaving is omitted for simplification.

As described above, parallel processing is performed in decoding. Parallel processing is described as follows. In turbo decoding, an input code block is divided into a plurality of sub blocks. A plurality of decoders (turbo decoders) process a plurality of sub blocks in parallel. In detail, each decoder decodes a sub block by a unit called window. This decoding process in each decoder is described later.

When sub blocks are accessed in parallel, a plurality of decoders in the second decoding unit accesses a plurality of columns of the interleaved memory. FIG. 16 shows an example of access of the plurality of decoders. In the example of FIG. 16, first and second columns of a memory space are accessed by a decoder A, third and fourth columns are accessed by a decoder B, fifth and sixth columns are accessed by a decoder C and seventh and eighth columns are accessed by the decoder C. In this example, a plurality of decoders access the fourth row at once at T1 as shown in FIG. 17. A memory bank of the interleaved memory is arranged along row direction. Therefore, above described operation of decoders causes a problem of access collision. Even if data shown as 31-37 in FIG. 16 is empty and the decoders do not access empty portion, a plurality of decoders simultaneously access same memory bank (third row in FIG. 19) as shown in FIGS. 19 to 21.

As described above, a turbo decoding device decodes a plurality of sub-blocks in parallel. When a plurality of decoders access a same memory bank in parallel decoding, processing speed becomes slow.

SUMMARY

In one embodiment, an error correction code decoding device comprises a first memory having a memory space like a matrix, a first decoding unit writing a first information into the first memory along a first direction, a second decoding unit reading the first information from the first memory along a second direction and a plurality of turbo decoders included in the second decoding unit, and differentiating access timing to a same row or same column with each other.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 16 shows access directions in memory spaces;

FIG. 17 shows access timing of turbo decoders;

FIG. 18 shows access collision of turbo decoders;

FIG. 19 shows access directions in memory spaces;

FIG. 20 shows access timing of turbo decoders; and

FIG. 21 shows access collision of turbo decoders.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
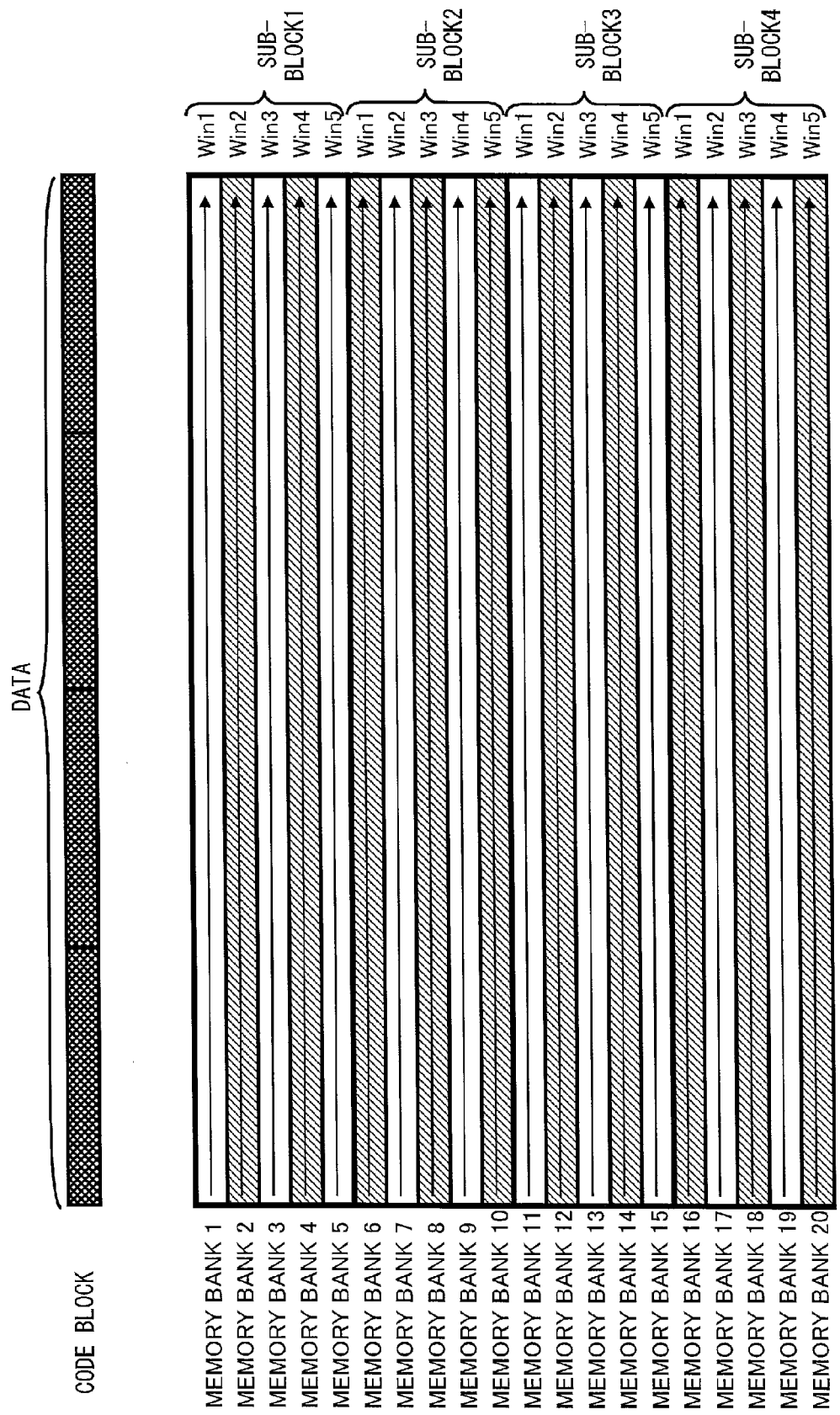
FIG. 1 shows a sequential access.
Figure 2:
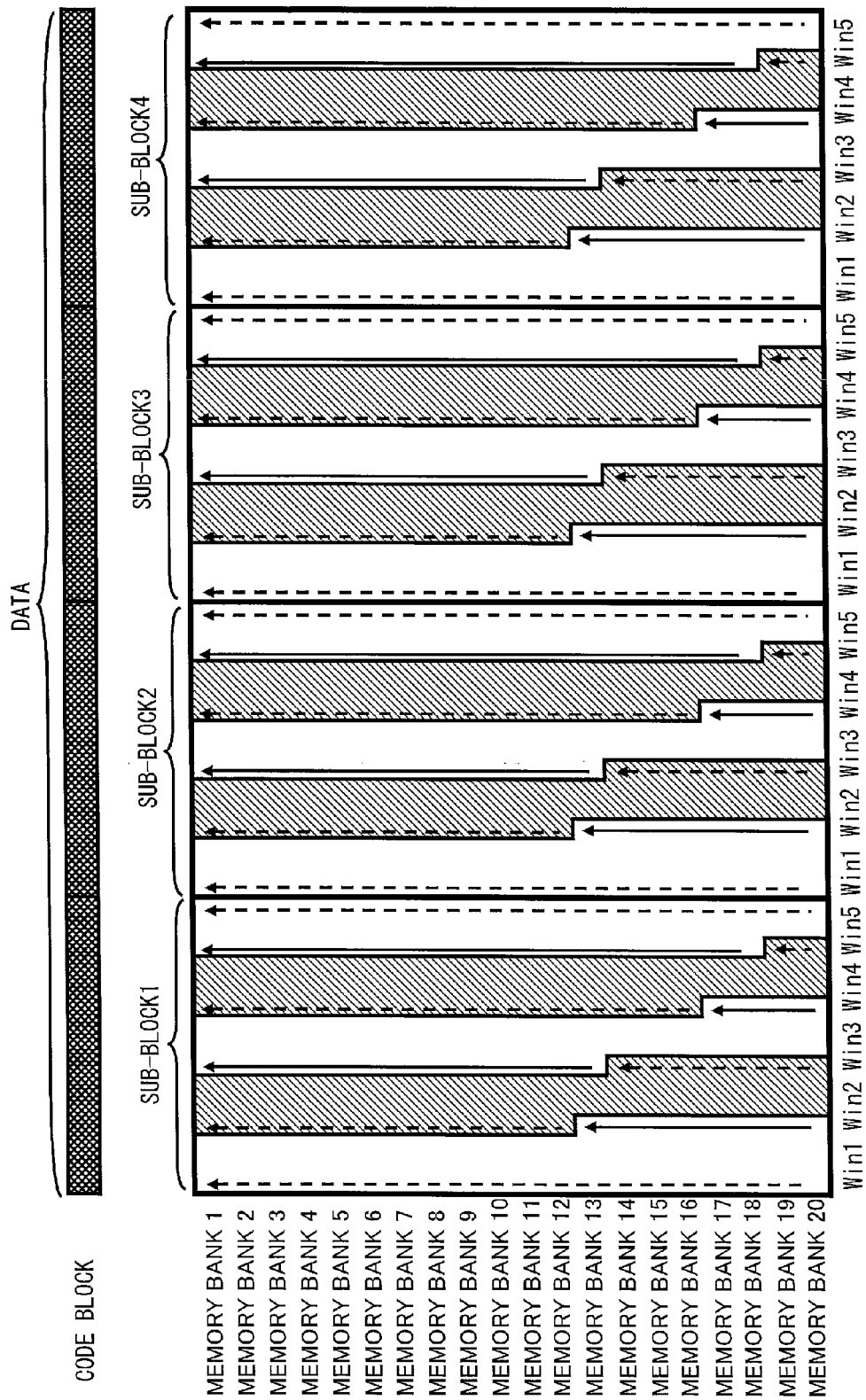
FIG. 2 shows an interleaved access.
Figure 13:
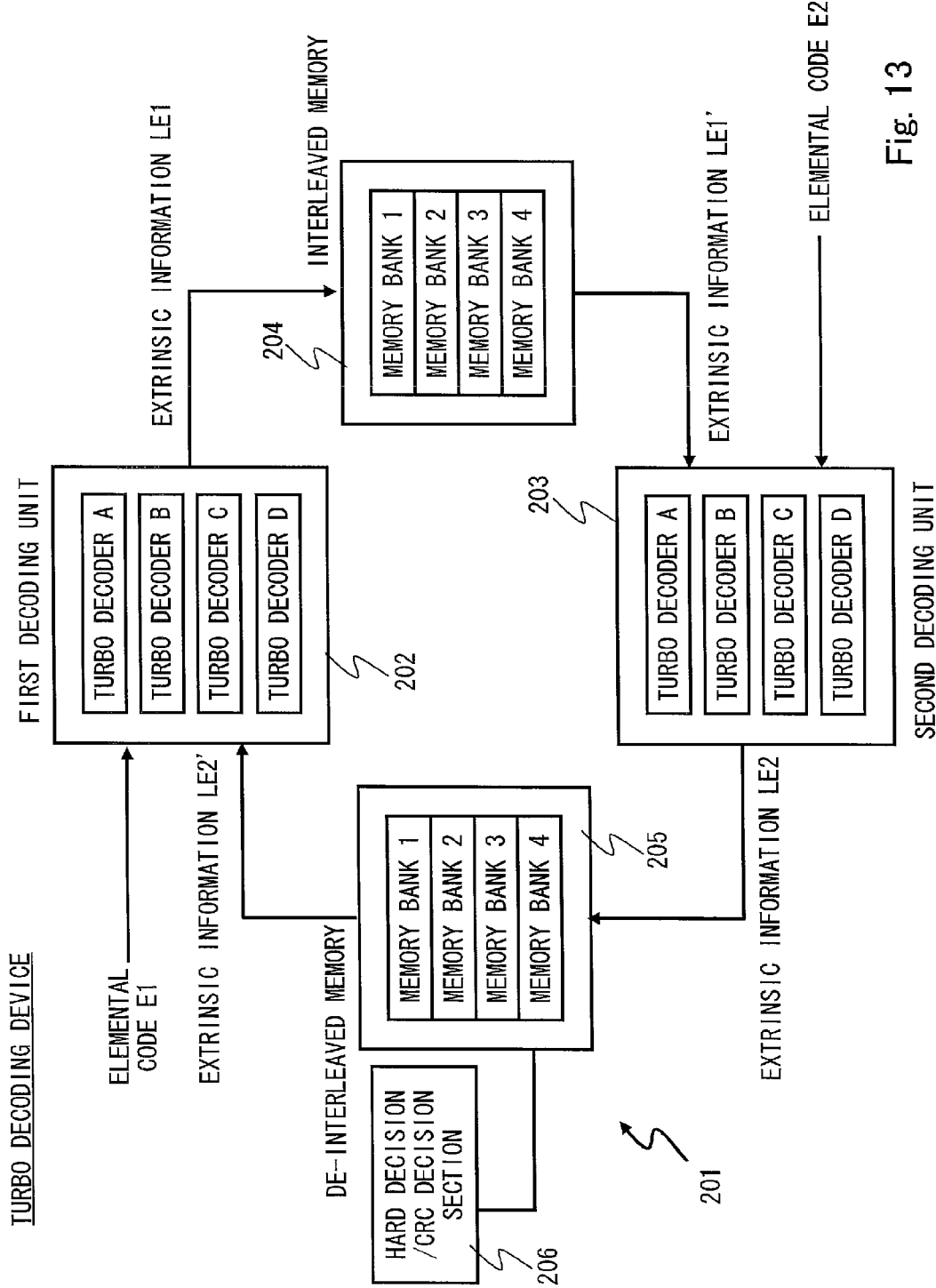
FIG. 13 shows a typical decoding device for turbo decoding.
Figure 14:
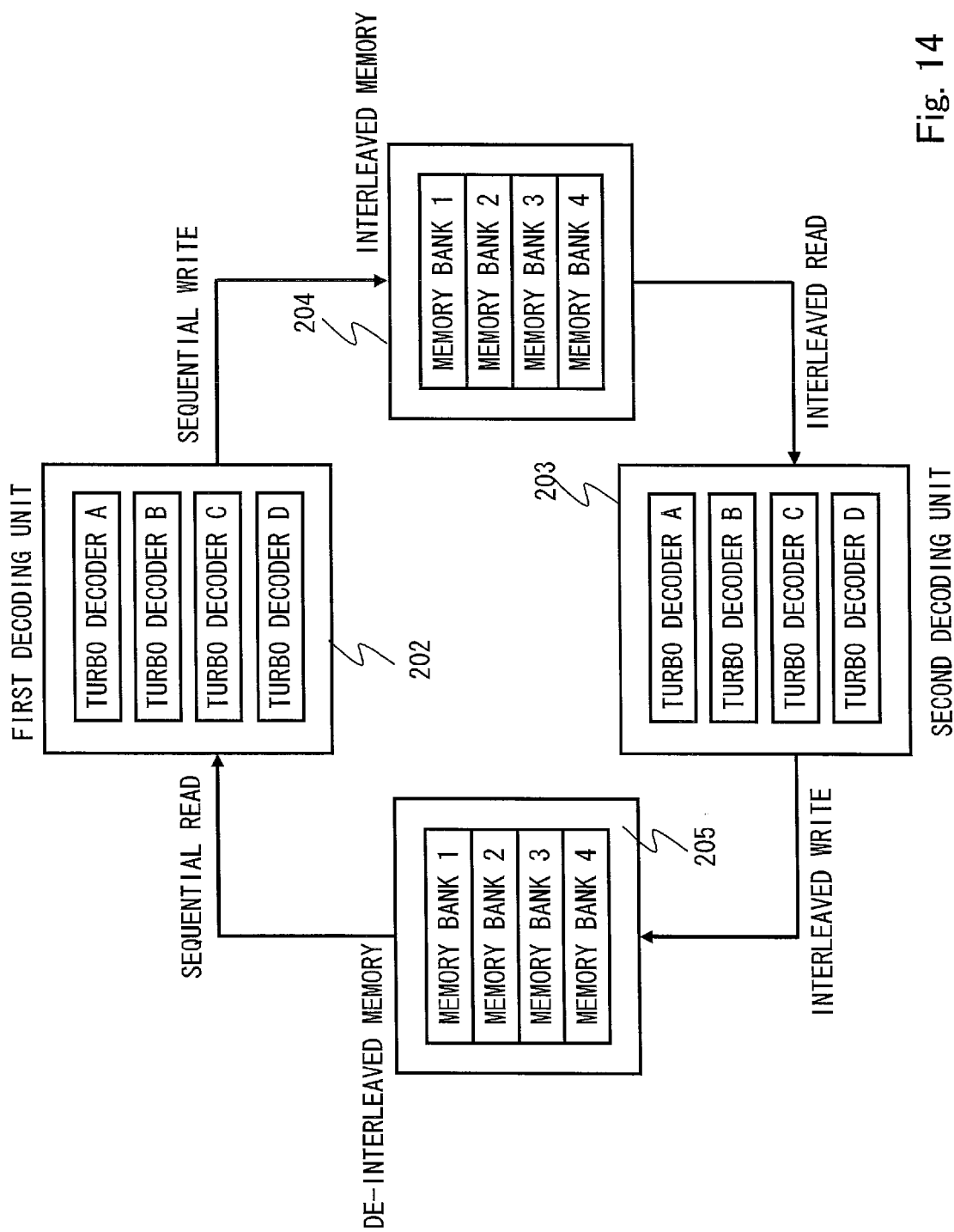
FIG. 14 shows relationships among the first decoding unit 202.
Figure 15:
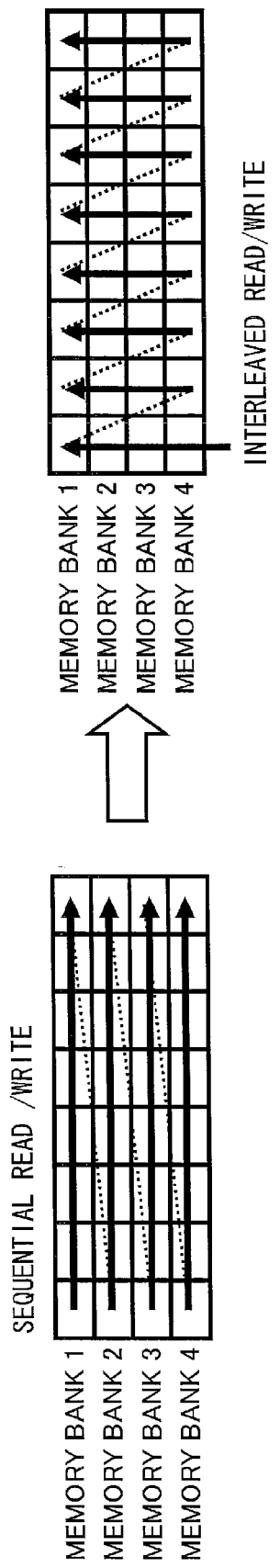
FIG. 15 shows access directions in memory spaces of the interleaved memory 204 and the de-interleaved memory 205.

A first embodiment of the present invention is described hereinafter in detail with reference to the drawings. A turbo decoding device of the present embodiment is similar to the turbo decoding device shown in FIG. 13. Therefore, detailed description of the turbo decoding device is omitted. A first decoding unit 202 and a second decoding unit 203 each has four turbo decoders A to D. Memory banks of an interleaved memory 204 and a de-interleaved memory 205 are arranged along row direction. In an actual decoding device, each memory has 20 banks, however, 4 banks are shown in FIG. 13 to simplify a drawing. In this embodiment, a coding block is divided into 4 sub-blocks, and 4 turbo decoders perform turbo decoding in parallel. As shown in FIG. 1, turbo decoders in a first decoding unit 202 perform sequential access to interleaved memory 204 and de-interleaved memory 205 (row direction access, left to right in FIG. 1). As shown in FIG. 2, turbo decoders in a second decoding unit 203 perform interleaved access to interleaved memory 204 and de-interleaved memory 205 (column direction access, bottom to top in FIG. 2).

Figure 3:
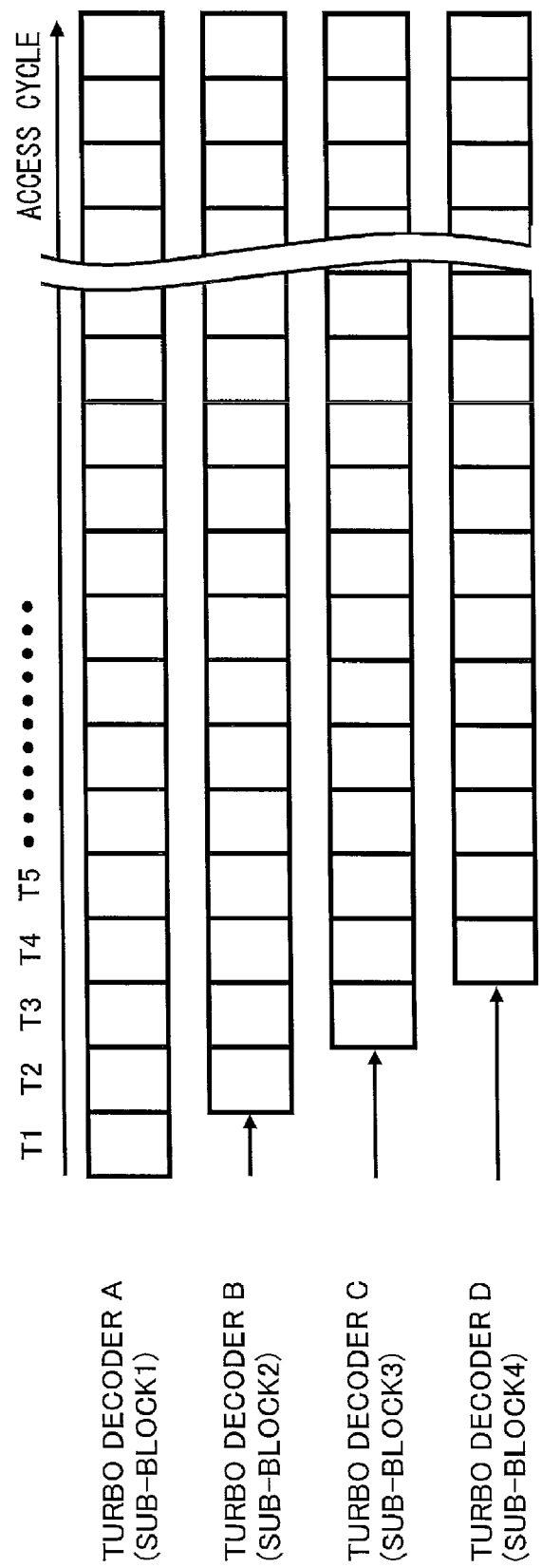
FIG. 3 shows access timing of 4 turbo decoders.

In this embodiment, access timing of 4 turbo decoders in the second decoding unit 203 which access along column direction is controlled. FIG. 3 shows access timing of 4 turbo decoders. As shown in FIG. 3, a turbo decoder A in the second decoding unit starts decoding sub-block 1 at timing T1. The turbo decoder A starts accessing a bank 20 of the interleaved memory 203 at T1. Then, at timing T2 which is later than timing T1 by one reference clock, the turbo decoder B starts decoding sub-block 2. At timing T2, access from the turbo decoder A to the bank 20 has finished, and the turbo decoder A starts accessing a bank 19. Therefore, the turbo decoder B is able to access the bank 20, and access collision does not occur. Then, at timing T3 which is later than timing T2 by one reference clock, the turbo decoder C starts decoding the sub-block 3. Similarly, the turbo decoder D accesses the sub-block 4 at T4.

In this embodiment, above described access control is performed by differentiating activation timing of each turbo decoder. That is, the turbo decoder B is activated with one clock intervals after the turbo decoder A activated, and the other turbo decoders are activated based on the other clock. An interval to activate turbo decoders is not limited to be one clock, and necessary number of clocks can be used for the interval. Further, turbo decoders of this embodiment do not ignore a bank with no data. Thereby, access collision does not occur caused by ignoring an empty bank.

As described above, interleaving of this embodiment is performed by writing data along row direction and reading data along column direction, and access timing to a memory from each turbo decoder is differentiated. Therefore, the decoding device of the present embodiment is prevented from access collision.

Figure 4:
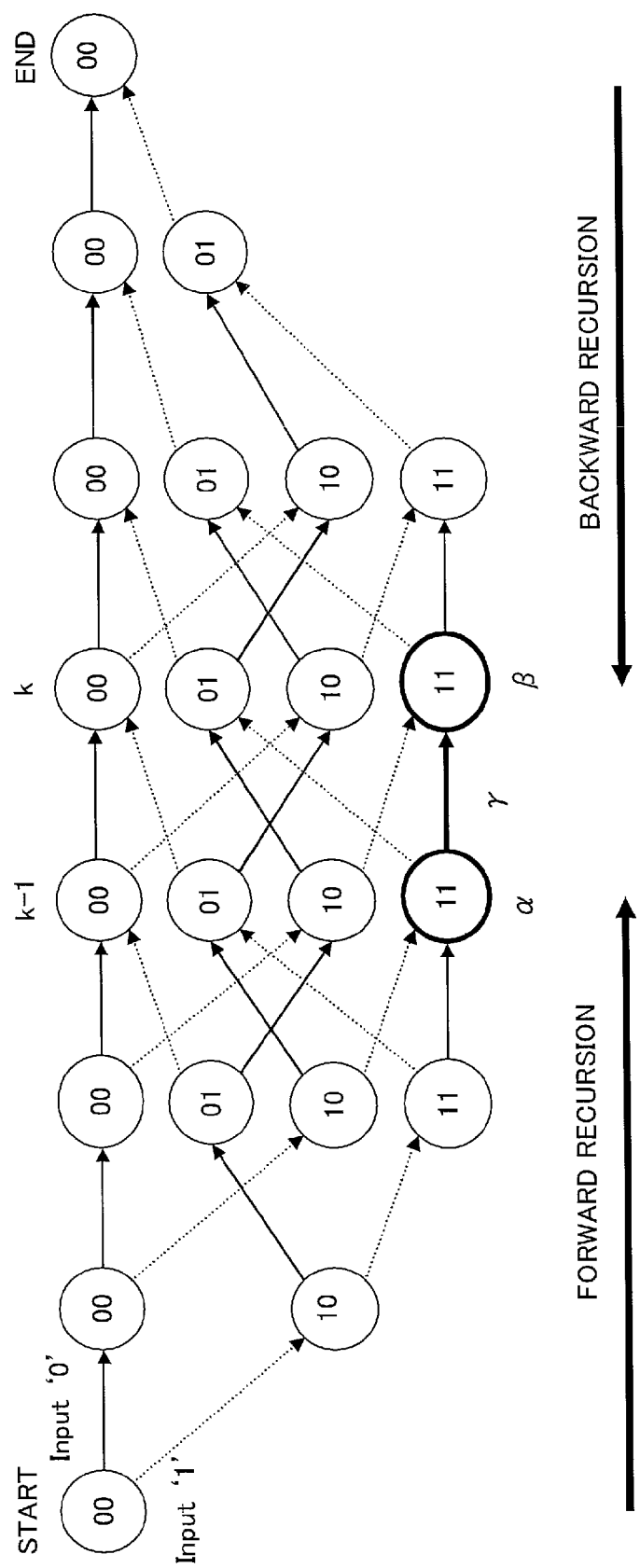
FIG. 4 shows a trellis diagram.

Decoding operation which is performed by the first decoding unit 202 and the second decoding unit 203 is described below. FIG. 4 shows a trellis diagram. In turbo decoding, it is called forward recursions that calculating a path metric value along a start point to end point using Viterbi decoding. The path metric value calculated by forward recursions is called αpath metric value (a first path metric value). Calculating a path metric value from end point to start point using Viterbi decoding is called backward recursions. The path metric value calculated by backward recursions is called βpath metric value (a second path metric value).

Figure 5:
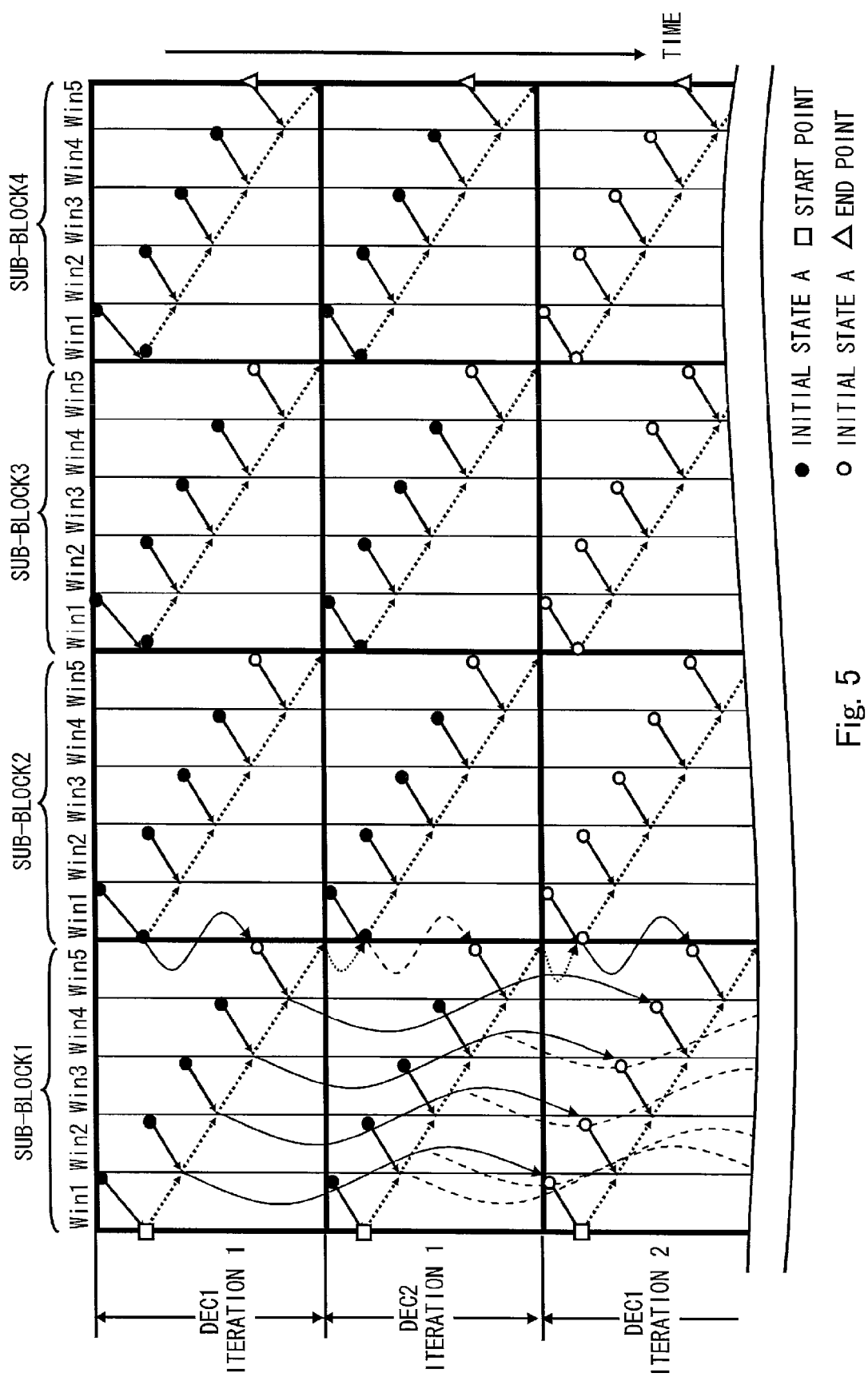
FIG. 5 is a view showing a forward recursions and backward recursions.

FIG. 5 is a view showing a forward recursions and backward recursions performed in this embodiment. In the turbo decoding device of the present embodiment, each turbo decoder decodes sub-blocks by a unit called window. A capacity of memory to hold a path metric value can be decreased by processing a unit called window. In forward recursions which starts decoding from a start point of trellis diagram, default path metric value of backward recursions at a border of the windows is set 0, that is, next window can be all situations and probability of all situations are same. Decoding process of the present embodiment is described in detail with reference to FIG. 5.

Each decoder of the first decoding unit 202 performs the backward recursion of window Win1 of each sub-block. Default path metric value of this backward recursion is 0 as described above.

Then, the forward recursion of window Win1 is performed. During the forward recursion of Win1, the backward recursion of window Win2 is performed. If first decoding unit 202 and second decoding unit 203 do not calculate window Win3 before, default path metric value is 0. That is, in turbo decoding, calculation of path metric is iterated, therefore default value of the border between Win2 and Win3 is set 0 in first calculation of Win2. When backward recursion of Win2 is finished, path metric value of a border between Win1 and Win2 is temporarily stored to use as a default value in second calculation in iteration.

Then, forward recursion about Win2 is performed. In this forward recursion, path metric value of the border between Win1 and Win2 is already calculated in forward recursion of Win1. Therefore, calculation result about Win1 is used as a default value in forward recursion of Win2. During forward recursion of Win2, backward recursion of window Win3 is performed. Similarly, other windows are calculated.

For example, one sub-block includes in 5 windows, and fifth window Win5 last to next sub-block. Therefore, in backward recursion of Win5 of sub-block 1, path metric value calculated in backward recursion win1 of sub-block 2 is used as a default value.

Then, the second decoding unit 203 performs similar operation on interleaved data. When the second decoding unit 203 finishes a calculation of all sub-blocks, the first decoding unit 202 (turbo decoders in first decoding unit 202) starts second decoding for iteration (second calculation in iteration). Further, the first decoding unit 202 performs similar operation on de-interleaved data for iteration. As shown in FIG. 5, a default value of each window border is set based on the result of the backward recursion carried out first time. When first decoding unit 202 finishes a calculation of all sub-blocks, the second decoding unit 203 starts second decoding for iteration using the result of the backward recursion carried out first time.

As described above, in case code block is divided into a plurality of sub-blocks and parallel decoding are performed, access timing of decoders are differentiated. Therefore, accessed timing of each sub-block is differentiated, and access collision for same memory bank is prevented. In decoding, window of sub-block are used as a unit for forward recursions and backward recursions. In first backward recursions, 0 is used as a default value, and in iterated backward recursions, result of last backward operation is used as a default value.

Second Embodiment

Figure 6:
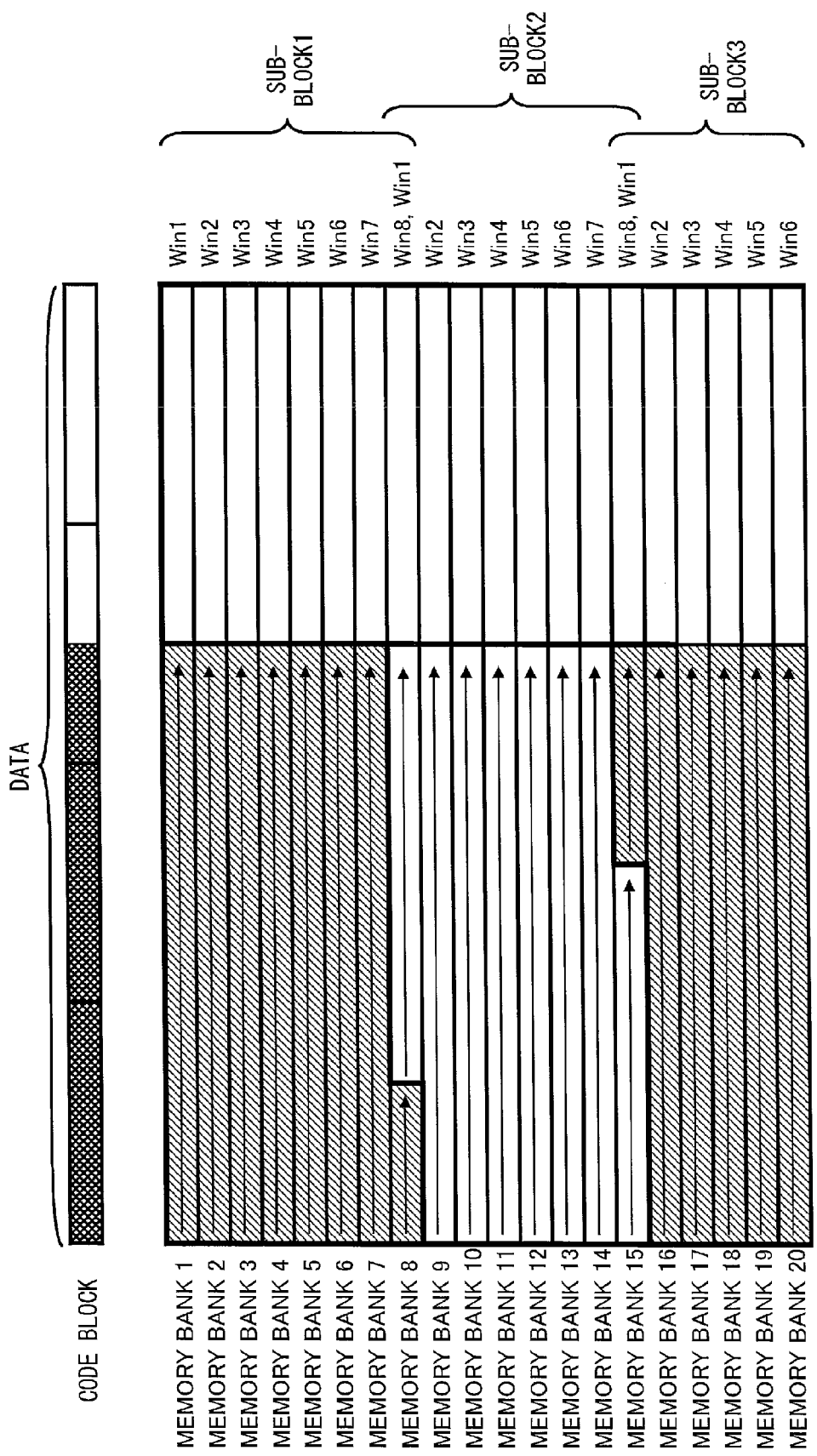
FIG. 6 shows relationships among a code block and a sub-block and a memory of a second embodiment.
Figure 7:
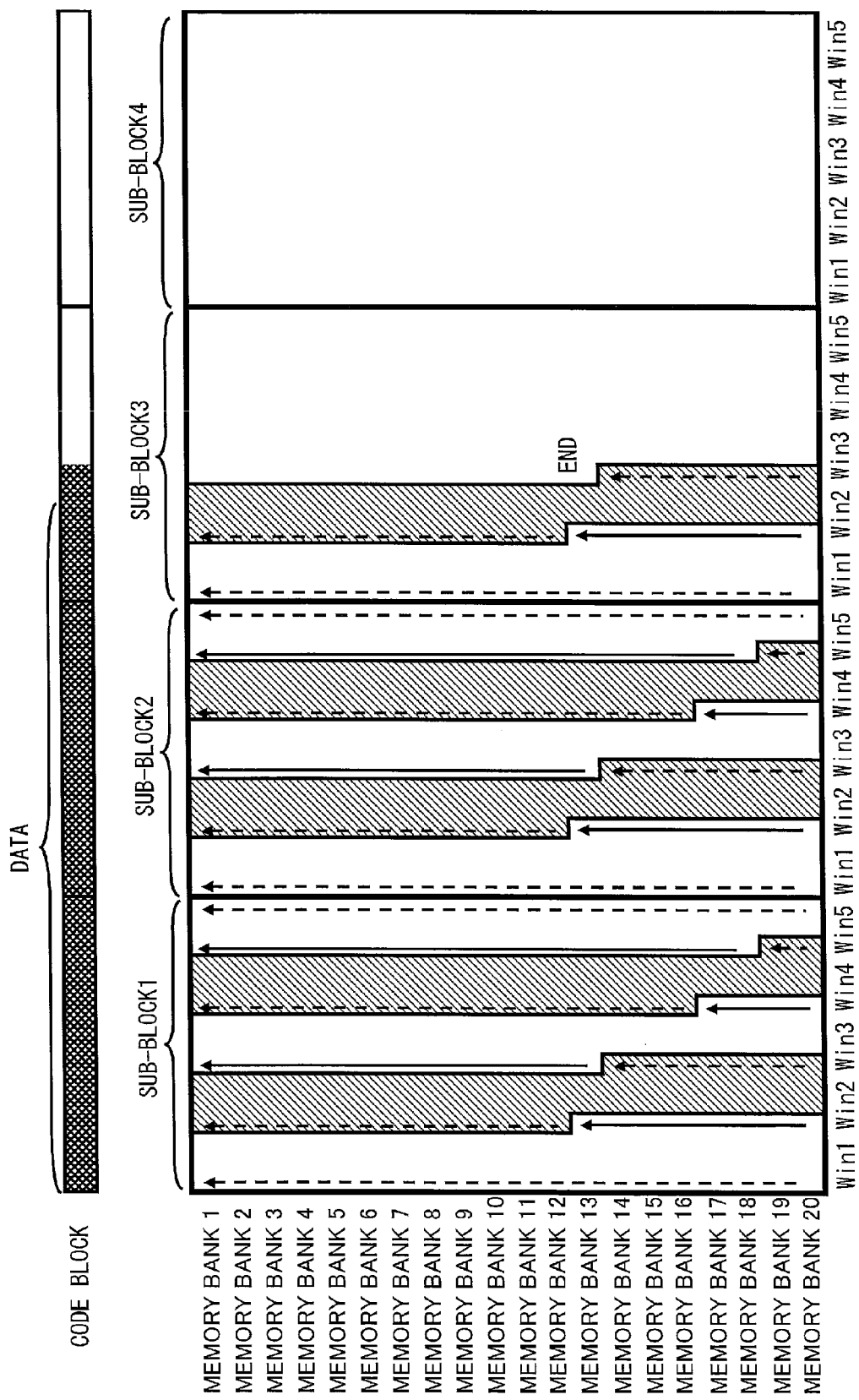
FIG. 7 shows relationships among a code block and a sub-block and a memory of a second embodiment.
Figure 8:
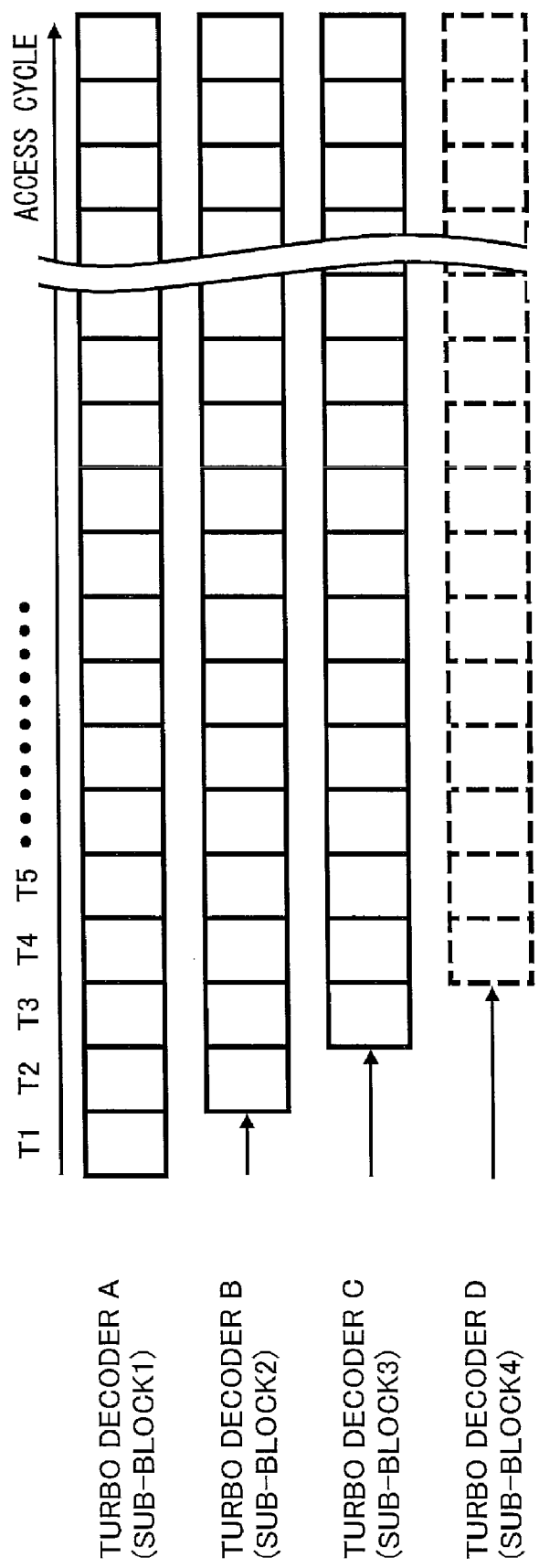
FIG. 8 is a drawing to describe access of a turbo decoder of the second embodiment.

FIGS. 6 and 7 show relationships among a code block and a sub-block and a memory of a second embodiment. FIG. 8 is a drawing to describe access of a turbo decoder of the second embodiment. As shown in FIGS. 6 and 7, a code block is less than a capacity of memory. As shown in FIG. 7, a code block is stored in sub-block 1, sub-block 2 and a part of sub-block 3, and not stored in sub-block 4. In this case, turbo decoders A, B and C of the second decoding unit 203 access the interleaved memory 204 as described in the first embodiment. That is, access timing of decoders are different by one clock each other. On the other hands, turbo decoder D does not access the interleaved memory 204, and does not decode data. Sub-blocks calculated in parallel become less than that of all the decoders are used. However, that does not cause a problem because the code block is not large.

Third Embodiment

Figure 9:
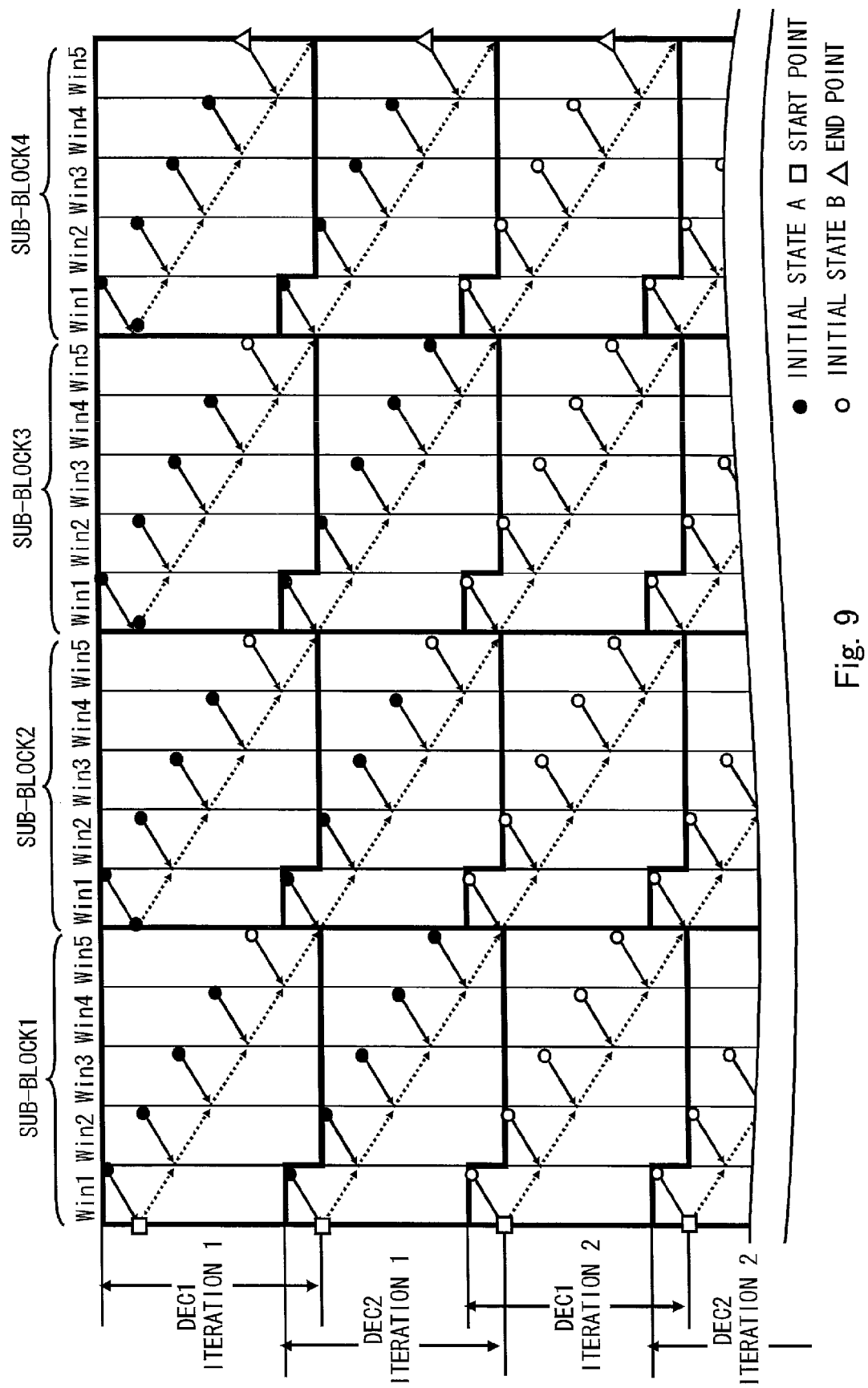
FIG. 9 shows a forward recursions and a backward recursions in a third embodiment.

FIG. 9 shows forward recursions and backward recursions in a third embodiment. In forward recursions shown in FIG. 5, while forward recursions of last window is performed, only forward recursions of Win5 is performed. In this embodiment, while forward recursions of last window is performed by the first 400 decoding unit, the second decoding unit 203 starts backward recursions of Win1. Since forward recursions of last window and backward recursions of Win1 of sub-block1 can be performed in parallel, decoding speeds up as a whole and time to decode can be shortened.

Fourth Embodiment

Figure 10:
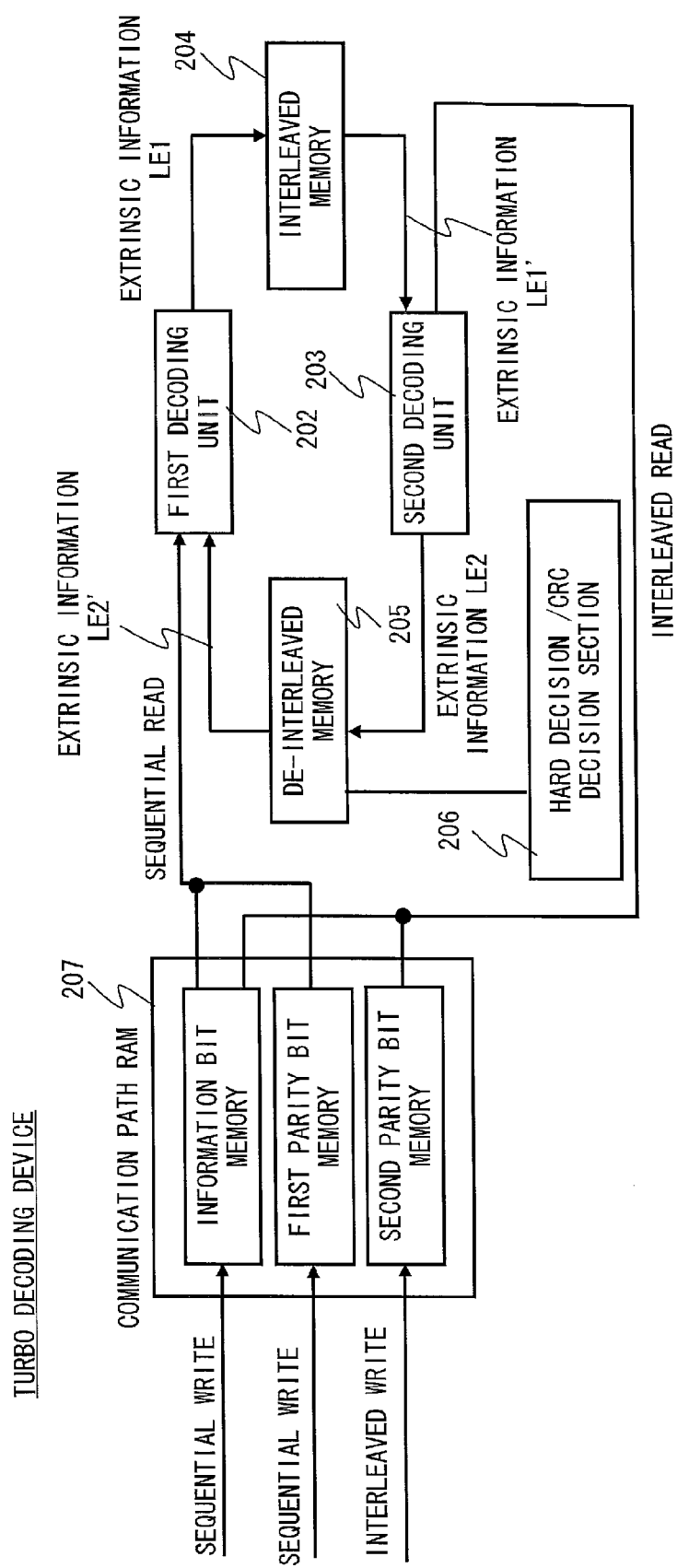
FIG. 10 shows a decoding device according to fourth embodiment.

FIG. 10 shows a decoding device according to fourth embodiment. A communication path memory 207 is shown in FIG. 10. In this embodiment, a communication path memory 207 stores parity bits pb of a second elemental code with interleaved pattern. That is, a parity bit pb is written in a communication path memory 207 with interleaved pattern. A first elemental code is written in communication path memory with sequential pattern. The second decoding unit 203 read out memory in interleaved pattern. Therefore, if a parity bit pb is written by interleaved pattern in the communication path memory 207, a parity bit pb written in interleaved pattern can be properly read out by the second decoding unit 203. Writing a parity bit of second elemental code with interleaving pattern in communication path memory, a memory to store information bit, a parity bit of the first elemental code and a parity bit of the second elemental code can be written in one sequential memory. Number of memory for decoding device can be reduced.

Other Embodiments

In the above described embodiments, interleaving is performed by using an interleaving pattern memory. The interleaving pattern memory stores a relationship of address between an interleaved pattern and de-interleaved pattern. An interleaver controls address when the interleaved memory is accessed. The interleave pattern memory stores address of interleaved memory, therefore the capacity of the interleave pattern memory is about the same as an interleaved memory. In case that the interleave pattern memory has to have a large capacity, a plurality of interleavers can be prepared based on number of turbo decoders.

Figure 11:
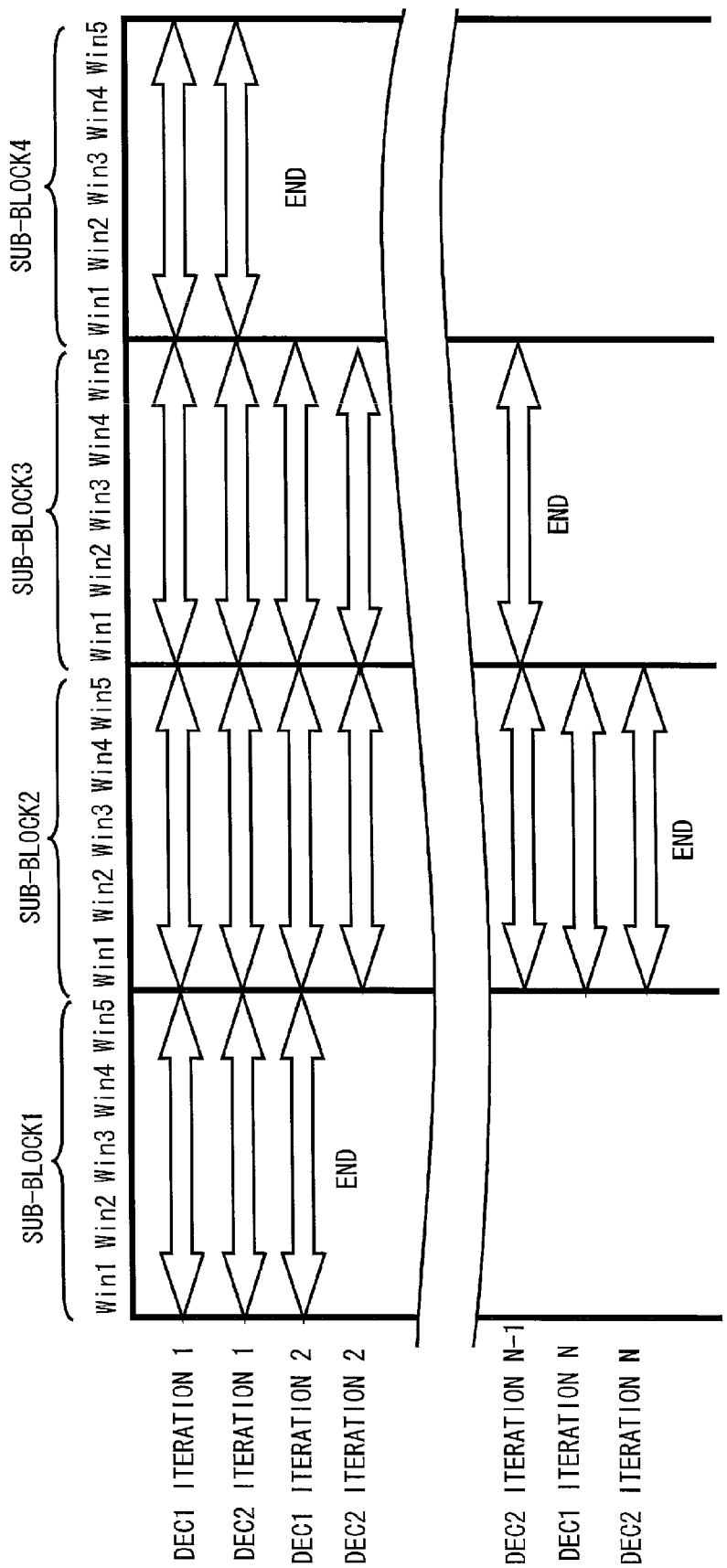
FIG. 11 is a drawing to describe other modification of the present invention.
Figure 12:
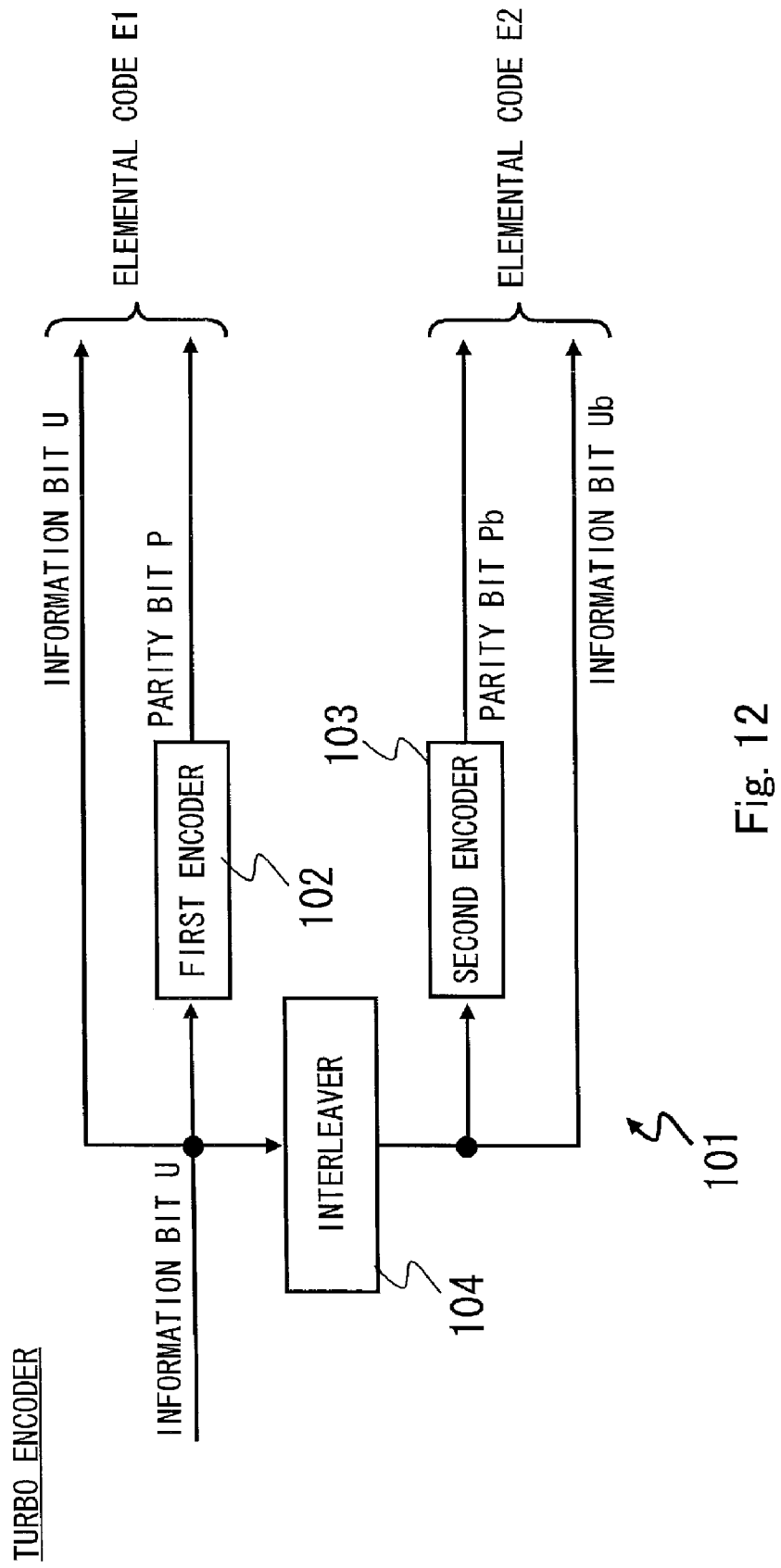
FIG. 12 is a block diagram showing the structure of a typical encoding device for generating turbo codes.

FIG. 11 is a drawing to describe other modification of the present invention. In the embodiments, a plurality of turbo decoders are used and code block is processed in parallel. In parallel decoding, iteration number has not to be the same in all decoders. Iteration number to make a hard decision may be different in decoders.

In order to speed up process, tail bits can be processed before decoding, and can be stored in a memory.

In the above described embodiments, two single port memories are used as interleaved memory and de interleaved memory. Thereby, one of the two memories can be used as read only memory, and another memory can be used as write only memory. Extrinsic information is written and read by switching the read only memory and write only memory. However, address used in decoder is address read before. Therefore, when memories operates twice faster clock than decoder, a first half of clock can be used as read clock and second half of clock can be used as write clock. Two single port memories that are used as an interleaved memory and a de-interleaved memory perform as pseudo-two-port memory. Thereby, scale of circuit is shrunk. When writing address corresponds to a read address which is read last, pseudo-two-port memory access can be performed to inner memories of decoders. The row side direction bank is only shown in the embodiment, however, the bank can divide in column direction.

It is apparent that the present invention is not limited to the above embodiment, but may be modified and changed without departing from the scope and spirit of the invention.

What is claimed is:

1. A decoding device comprising:
   a memory;
   a first decoding unit configured to write information to the memory along a first direction in a memory space of the memory; and
   a second decoding unit configured to read the information from the memory along a second direction different from the first direction in the memory space of the memory and to decode a coding block based on the information;
   wherein the second decoding unit comprises a first decoder that decodes a first sub-block included in the coding block and a second decoder that decodes a second sub-block included in the coding block,
   wherein the first decoder starts accessing the memory to read the information therefrom whereas the second decoder starts accessing the memory later than the first decoder to read the information therefrom.

2. The decoding device according to claim 1, wherein the first direction is one of row and column directions in the memory space of the memory and the second direction is the other of row and column directions.

3. The decoding device according to claim 1, wherein the second decoder starts accessing the memory one reference clock later than the first decoder.

4. The decoding device according to claim 1, wherein the second decoder decodes the second sub-block in partially parallel with the first decoder.

* * * * *